United States Patent [19]

Kokaku et al.

[11] Patent Number: 4,560,641

[45] Date of Patent: Dec. 24, 1985

[54] METHOD FOR FORMING FINE MULTILAYER RESIST PATTERNS

[75] Inventors: Yuuichi Kokaku; Makoto Kitoo; Yoshinori Honda, all of Yokohama, Japan

[73] Assignee: Hitachi, Ltd., Tokyo, Japan

[21] Appl. No.: 478,666

[22] Filed: Mar. 25, 1983

[30] Foreign Application Priority Data

Mar. 26, 1982 [JP] Japan .................................. 57-47093
Sep. 22, 1982 [JP] Japan ................................. 57-163849

[51] Int. Cl.[4] ............................................... G03C 5/00
[52] U.S. Cl. .................................... 430/312; 430/322; 430/325; 430/326; 430/330; 427/41
[58] Field of Search ............... 430/312, 313, 325, 330, 430/323, 322, 326; 156/643; 427/43.1, 41

[56] References Cited

U.S. PATENT DOCUMENTS

| | | | |
|---|---|---|---|
| 4,180,604 | 12/1979 | Feng et al. | 430/270 |
| 4,283,482 | 8/1981 | Hattori et al. | 430/296 |
| 4,307,178 | 12/1981 | Kaplan et al. | 430/296 |
| 4,332,879 | 6/1982 | Pastor et al. | 430/272 |
| 4,352,870 | 10/1982 | Howard et al. | 430/271 |
| 4,396,704 | 8/1983 | Taylor | 430/311 |
| 4,454,200 | 6/1984 | Betlott, Jr. | 428/411.1 |
| 4,493,855 | 1/1985 | Sachdev et al. | 427/41 |

OTHER PUBLICATIONS

Hattori et al., "A Breakthrough to Plasma Deposited Dry-Developable E-Beam Resist," Society of Plastics Engineers, Nov. 8-10, 1982 Ellenville, N.Y.
Taylor et al., J. Vac. Sci. Technol., 19(4), Nov./Dec. 1981, pp. 872-880.

*Primary Examiner*—John Kittle
*Assistant Examiner*—José G. Dees
*Attorney, Agent, or Firm*—Antonelli, Terry & Wands

[57] ABSTRACT

Fine resist patterns having high sensitivity and steeply improved residual film ratio is obtained by forming a multilayer film consisting of organic substances on a substrate, making at least one layer other than the lowest layer of said multilayer film contain metal elements, irradiating said multilayer film with light or radiations, and developing with plasma.

16 Claims, 5 Drawing Figures

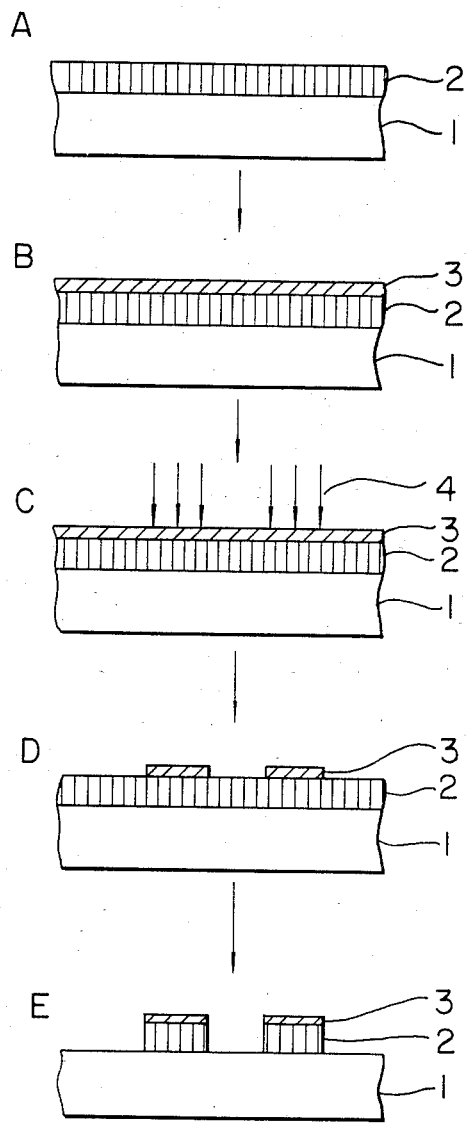

METHOD FOR FORMING FINE MULTILAYER RESIST PATTERNS

BACKGROUND OF THE INVENTION

1. Field of the Invention

The present invention relates to a method for forming fine resist patterns, in particular, a method for forming fine resist patterns to semiconductors, ICs, bubble memories and the like by performing a dry resist development process.

2. Description of the Prior Art

Hitherto for the formation of fine resist patterns to semiconductors, the following steps have been carried out:

(a) A resist prepared by dissolving an organic highpolymer in a solvent is spin-coated on the substrate.

(b) The coated film is dried.

(c) The dried film is exposed to light or radiations such as electron beam, X-rays, α-rays, or ion beams.

(d) A pattern is formed by a wet development process utilizing the difference of solubility to a solvent between the part exposed to light or radiations and the part not exposed.

However, the above mentioned method have some problems that a large amount of solvent is required; in the course of forming a pattern by development the pattern swells with the solvent to spoil the dimensional accuracy; the sensitivity of resist itself is made not uniform; and the sensitivity lowers due to a change with the passage of time.

Besides, the dry lithography is known, which prepares a resist film by plasma polymerization and forms a resist pattern by oxygen plasma development (J. Appl. Phys. vol. 51, p. 3938, 1980).

However, in the above mentioned method the sensitivity has been poor and the ratio of film thickness of the part remaining as a pattern after the development to the film thickness before the development (hereafter called the residual film ratio) is in the extent of 10 to 15%, at best 50 to 60%, so that it has been difficult to obtain a film thickness bearable to the subsequent selective etching (Japanese Patent Laid-open No. 72175/'77).

SUMMARY OF THE INVENTION

An object of the present invention is to provide a method for forming fine patterns having high sensitivity and steeply improved residual film ratio.

The object of the present invention has been attained by making an upper layer of a substance having a low rate of plasma development and a lower layer of a substance having a high rate of plasma development, and developing with plasma to form fine patterns. More particularly, said upper layer is formed by dissolving in a solvent at least one compound selected from organosilicon high polymers, organosilicon compounds, organoaluminum compounds, organotin compounds, and organolead compounds with other organic high polymers than said organosilicon high polymers to form a solution; and applying the solution on the lower layer to form a coated film. Said upper layer may be formed by a plasma polymerization caused by generating a plasma discharge in a mixed atomosphere of at least one compound selected from organosilicon compounds with at least one monomers described below. Thereafter the upper layer is subjected to a plasma development.

The further improvement of the sensitivity can be attained by adding to the above mentioned solution at least one compounds selected from halogen containing high polymers, epoxy group containing highpolymers and sulfone group containing high polymers or to the above mentioned plasma discharge atmosphere at least one compound selected from halogen substituted styrenes and epoxy compounds.

It is considered that the low rate of plasma development of said upper layer results from the generation of oxides such as $SiO_2$, $Al_2O_3$, $SnO_2$ or PbO in the film when exposed to oxygen plasma.

On the other hand, if the thickness of upper layer is thinner than the lower layer, the residual film ratio is more improved.

The materials and manufacturing processes used in the present invention are explained as below.

First, in the resist film forming step in FIG. 1, as seen in FIG. 2, on a substrate 1 of a silicon wafer or a chrome coated glass is formed an organic thin film 2 having a thickness of 0.5 to 2 μm, and further thereon an organic thin film 3 having a thickness of 0.01 to 0.2 μm and containing Si, Al and the like is formed to produce a multilayer resist 10. The thin film forming method may be spinner coating, while the plasma polymerization process can provide an uniform film thickness and reduce defects such as pin holes.

This resist film 10 is exposed to light or radiations 7. Then it is developed with a plasma containing fluorine and subjected to the plasma development step of upper layer of FIG. 1 to form the pattern of thin film 3 shown in FIG. 2 as B or B'.

Thereafter the plasma development of lower layer of FIG. 1 is done with a plasma containing oxygen to erode away the exposed part of thin film 2 and obtain the resist pattern shown in FIG. 2 as C or C'.

A heating step at 100° to 200° C. may be inserted between the exposure and the plasma development of upper layer steps.

For the lower layer of resist layer is desirable the materials able to be developed with oxygen plasma. Concretely the lower layer is formed by dissolving at least one high polymer compound selected from the compounds (a) to (d) in a solvent to form a solution, applying the solution on the substrate by spin-coating and drying:

(a) polystyrene, polychlorostyrene, poly-α-methylstyrene, polychloromethylstyrene, brominated polystyrene, iodinated polystyrene and other polystyrene derivatives;

(b) poly(methyl methacrylate), poly(ethyl methacrylate), poly(propyl methacrylate), poly(butyl methacrylate), poly(phenyl methacrylate), poly(methyl acrylate), poly(vinyl acetate), poly(methyl vinyl ketone), poly(methyl isopropenyl ketone), poly(phenyl isopropenyl ketone), phenolic resin, polyester, polyether, epoxy resin and other oxygen containing highpolymers;

(c) polysulfon, polysulfide and other sulfur containing highpolymers;

(d) polyamide, polyimide, polyacrylonitrile, polymethacrylonitrile and other nitrogen containing highpolymers.

The lower layer can be formed by plasma polymerization of at least one monomers selected from the compounds (e) to (i).

(e) ethylene, propylene, butene, butadiene, isoprene, and other hydrocarbons;

(f) vinyl chloride, vinylidene chloride, chloroprene, vinylidene fluoride, tetrafluoroethylene, trichloroethylene, tetrachloroethylene and other halogenated hydrocarbons;

(g) styrene, chlorostyrene, α-methylstyrene, chloromethylstyrene, brominated styrene, iodinated styrene and other styrene derivatives;

(h) methyl methacrylate, ethyl methacrylate, propyl methacrylate, butyl methacrylate, phenyl methacrylate, methyl acrylate, vinyl acetate, methyl vinyl ketone, methyl isopropenyl ketone, phenyl isopropyl ketone, phenols, ester compounds, ether compounds, epoxy compounds and other oxygen containing compounds;

(i) amides, imides, acrylonitrile, methacrylonitrile and other nitrogen containing compounds.

Preferably the lower layer is formed by spin-coating and drying a solution of polystyrene, phenol resin or polyimide in solvent or by plasma polymerizing styrene, phenol or imide monomer.

The upper layer of the resist layer is formed by applying the following mixture (j), if necessary adding solvent, by means of spin-coating and drying:

(j) a mixture of at least one compounds selected from (i) organosilicon high polymers such as polydimethsiloxane, polyvinyltrimethylsilane, polymethacryloxytrimethylsilane and (ii) organosilicon compounds selected from silane compounds such as tetramethylsilane, tetravinylsilane, tetramethoxysilane, methyltriethylsilane, siloxanes such as hexamethyldisiloxane, 1,3-divinyl-1,1,3,3-tetramethyldisiloxane, silazanes such as hexamethyldisilazane, and (iii) organometallic compounds such as trimethyl aluminium, triethyl aluminum, tetramethyl tin, tetraethyl tin, tetramethyl lead, and tetraethyl lead with at least one compound selected from high polymers mentioned in said (a) to (d).

Besides, the upper layer is formed by plasma polymerization of the following mixture (k).

(k) a mixture of at least one organosilicon compounds selected from silane compounds such as tetramethylsilane, tetravinylsilane, vinyltrimethylsilane, divinyldimethylsilane, trivinylmethylsilane, diallyldimethylsilane, tetraethylsilane, tetramethoxysilane, vinyltrimethoxysilane and methyltriethylsilane; siloxanes such as hexamethyldisiloxane, 1,3-divinyl-1,1,3,3-tetramethyldisiloxane; and silazanes such as hexamethylsilazane with at least one monomer selected from the above mentioned (e) to (i).

In order to improve the sensitivity of upper layer of the resist layer the abovementioned solution of (j) is mixed with at least one high polymers compound selected from the compounds described in following (i) to (iii):

(i) polychloromethylstyrene, iodinated polystyrene and other halogen containing high polymers;

(ii) poly(glycidyl methacrylate), epoxidated polybutadiene and other epoxy group containing high polymers;

(iii) polyolefinsulfon and other sulfon group containing high polymers.

Besides, the mixture of (k) may be mixed with at least one compound selected from chloromethylstyrene, iodinated styrene, butadiene monoxide, glycidyl methacrylate, allylglycidyl ether, epichlorohydrin and epibromohydrin, and then subjected to a plasma discharge to cause plasma polymerization.

Next, a description is made in regard to the plasma polymerization. For the aforementioned plasma polymerization are employed the apparatuses of high-frequency discharge type, microwave discharge type and separative type in which the discharge part and the polymerization part are separated. These plasma generating apparatuses give little damage to the substrate surface. The electric power of discharge is less than 50 W, desirably 1 to 20 W. The discharge power less than 50 W can not cause decomposition of epoxy groups.

For the plasma development are employed the plasma-generators of parallel plate electrode type (or diode type), barrel type, high-frequency inductive coupling type, and microwave discharge type. The electric power of discharge ordinarily is 100 to 300 W, and the gas pressure is 0.01 to 0.5 Torr. If the plasma development is carried out using a parallel plate electrode type plasma generator under the electric power of discharge of 100 to 300 W and the gas pressure of 0.1 Torr or the extent, the development accuracy is more improved.

The gas used for the plasma development of upper layer of said resist layer is a mixture of one kind of gas selected from fluorinated hydrocarbons, for example $CF_4$, $CClF_3$, $CCl_2F_2$, or $C_2F_6$, and one kind of gas selected from the group consisting of Ar, He, Ne, Xe, $O_2$, and $N_2$, in a partial pressure ratio of 1: (5 to 100). In particular, in case a gas mixture of $CF_4$ and one kind of gas selected from the group consisting of Ar, He, Ne, Xe, $O_2$ and $N_2$ is employed in a partial pressure ratio of 1: (5 to 100), a good result is obtained.

On the other hand, for the plasma development of lower layer of said resist layer was employed $O_2$ or a mixture of $O_2$ and one kind of gas selected from the group consisting of Ar, He, Ne, Xe and $N_2$ in a partial pressure ratio of 1:1 to 10.

BRIEF DESCRIPTION OF THE DRAWING

FIG. 5 illustrates the third embodiment of plasma development according to the present invention.

DETAILED DESCRIPTION OF THE PREFERRED EMBODIMENTS

Figure 1:
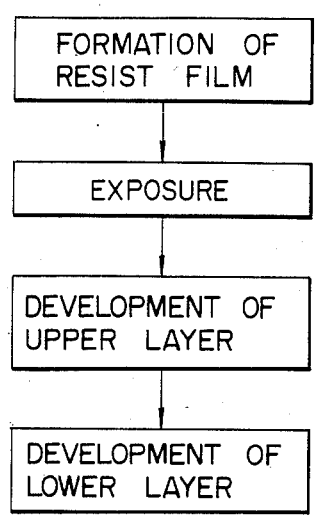
FIG. 1 and FIG. 2 are the flow charts illustrating the first embodiment of plasma development of double layer resist films according to the present invention.
Figure 2:
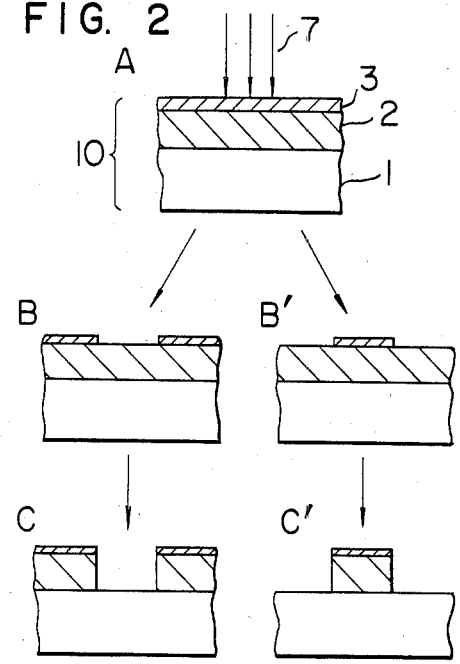
Figure 3:
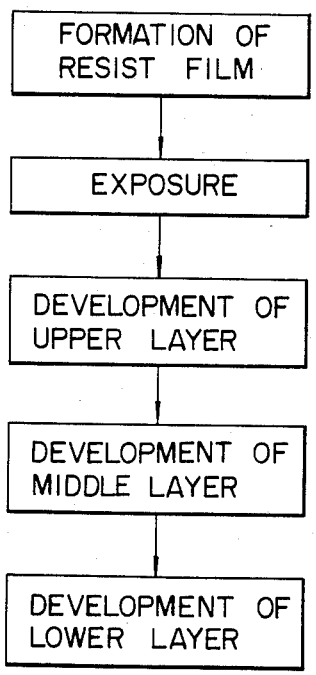
FIG. 3 and FIG. 4 illustrate the second embodiment of plasma development of triple layer resist films according to the present invention.

The present invention is explained by the examples below.

EXAMPLE 1

On a silicon wafer was applied polyimide by spinner coating to form a thin film of polyimide having a thickness of 1 μm. After the thin film was dried, a mixture of poly(glycidyl methacrylate) and dimethyl-diphenylsilane in a volume ratio of 5:1 was applied thereon into a thickness of 0.2 μm to form a double layer resist film.

The resist film was irradiated with an electron beam of acceleration voltage 20 kV in $5 \times 10^{-6}$ C./cm$^2$.

This was brought into contact with a plasma of gas mixture consisting of oxygen and $CF_4$ (volume ratio 3:1, total pressure 0.5 Torr) and held for 4 minutes under the electric power of 100 W, so that at the irradiated part the upper layer film of 300 Å was left behind and at the non-irradiated part the lower layer film was exposed.

This was developed with an oxygen plasma (pressure: 0.5 Torr, electric power: 400 W), so that only the part not covered with the upper layer film was selectively developed to form a negative type resist pattern having a thickness of 1 μm.

From this result the residual film ratio was 83%.

The similar experiments in which the material of lower layer was replaced with poly(methyl methacrylate), polystyrene, polyisoprene, or polystyrene made by plasma polymerization, were carried out, and in every case the same result was obtained.

EXAMPLE 2

A silicon wafer was applied with polystyrene by spinner coating into a thickness of 1 μm, and after being dried was placed on a electrode plate of earth side in a vacuum vessel having a couple of parallel-plate electrodes, which was then evacuated into $10^{-4}$ Torr. After that a mixture of 1-chloro-2-butene and hexamethyldisilazane was made flow in to give their each partial pressure up to 0.1 Torr, and then a high-frequency electric power of 20 W was impressed between the electrodes to start discharge and plasma polymerization. After the plasma was held for 1 minute, on the polystyrene film was formed a plasmapolymerized film having a thickness of 0.06 μm.

The resist layer was irradiated with an electron beam of $2\times10^{-5}$ C./cm$^2$, and thereafter heated in vacuum at 150° C. for 30 minutes. After that it was developed in the same process as Example 1.

In the result a negative resist pattern was obtained in a residual film ratio of 95%.

EXAMPLE 3

A silicon wafer was placed on a electrode plate of earth side in a vacuum vessel having a couple of parallel plate electrodes, which vessel was evacuated into $10^{-4}$ Torr, and thereafter into which styrene gas was introduced to keep the total pressure at 0.2 Torr. The system was held under the electric power of 30 W for 10 minutes, so that a polymer film having a thickness of 0.75 μm was obtained. In succession into the vacuum vessel was introduced diallyldimethylsilane to keep the total pressure at 0.1 Torr, and was subjected to plasma polymerization under the electric power of 10 W for 2 minutes to form a polymer film of 0.05 μm on the plasmapolymerized styrene film.

The resist layer was irradiated with an electron beam of $2\times10^{-5}$ C./cm$^2$, and thereafter was developed in the same process as Example 1, so that a negative type resist pattern was obtained in a residual film ratio of 94%.

EXAMPLE 4

On a glass plate coated with vapor deposited chrome was formed a plasma-polymerized styrene film having a thickness of 0.5 μm in the same process as Example 3, and further thereon was formed a thin film of a mixture of poly(methyl methacrylate) and triethyl aluminium in a weight ratio of 10:1. The film has a thickness of 0.05 μm.

A pattern was drawn by an electron beam of $1\times10^{-4}$ C./cm$^2$, and thereafter the upper layer was developed with a plasma of mixed gas of carbon tetrachloride and oxygen, while the lower layer was developed with oxygen plasma.

A negative type pattern was obtained in a residual film ratio of 90%.

As explained above, by the method according to the present invention the residual film ratio of resist film in the plasma development can be greatly improved, so that a pattern having a thickness sufficient to be used for selective etching can be formed.

EXAMPLE 5

For the substrate 1 shown in FIG. 5 was employed a glass plate coated with vapor deposited chrome, and said substrate 1 was placed in a plasma generating apparatus of high-frequency wave parallel plate electrode type. Then styrene was made flow into the apparatus in a flow rate of 10 cc/min. The gas pressure was kept at 0.15 Torr and a discharge was held under a discharge power of 50 W for 20 minutes. A polystyrene layer (lower layer 2) having a thickness of 1.1 μm was formed on the substrate 1 (FIG. 5 (A)).

After evacuating the same apparatus, a gas mixture of allyl glycidyl ether and tetramethylsilane in a volume ratio of 1:1 was introduced into the apparatus. The inner pressure was kept at 0.2 Torr and plasma polymerization was held under a electric power of 10 W for 20 minutes. Thus the upper layer 3 was formed (B), having a thickness of 0.1 μm. After drawing a pattern on the double layer resist by an electron beam 4 of $1\times10^{-7}$ to $1\times10^{-5}$ C./cm$^2$ (C), the upper layer was developed with a mixed gas of CF$_4$/O$_2$ 1:1 in a plasma etching apparatus of parallel plate electrode type (D). Here the discharge was stopped after generating the plasma under a electric power of 100 W for 3 minutes, and the reactor was evacuated. Thereafter the plasma development of the lower layer 2 was carried out under the conditions of 0.5 Torr of O$_2$, 100 W and for 10 minutes (E). In case the electron beam dose was more than $5\times10^{-6}$ C./cm$^2$, all the lower layer 2 of the part irradiated with the electron beam was left behind and that of the non-irradiated part was removed to form a negative type pattern. On the other hand, in case the electron beam dose was less than $4\times10^{-6}$ C./cm$^2$, no pattern was formed.

EXAMPLE 6

Using a silicon wafer for the substrate 1, a double layer resist was formed in the same process as Example 5 (FIG. 5 (A),(B)). However, the plasma polymerization of the upper layer 3 was conducted using a gas mixture of glycidyl methacrylate and tetravinylsilane in a ratio of 1:1, and under the conditions of the gas pressure 0.12 Torr, discharge power 5 W and discharge time 2 minutes. Further, under the same conditions as Example 5 were carried out respectively the electron beam drawing (C), the upper layer development (D) and the lower layer development (E), and then a negative pattern was formed in $1\times10^{-6}$ C./cm$^2$ or more.

EXAMPLE 7

On a substrate of silicon wafer the plasma-polymerization of methyl methacrylate was carried out under the conditions of the gas pressure 0.2 Torr, electric power 80 W and for 30 minutes. Thereafter a gas mixture of butadiene monoxide and hexamethyl-disilazane in a mixing ratio 3:1 was polymerized with plasma under the conditions of the gas pressure 0.3 Torr, electric power 20 W and for 3 minutes. Here the thickness of lower layer 2 was 1.3 μm, while the thickness of upper layer 3 was 0.2 μm (FIG. 5 (A),(B)).

Further, the electron beam drawing (C) and the developments ((D), (E)) were carried out in the same way as Example 5, and the sensitivity of double layer resist was $4\times10^{-6}$ C./cm$^2$. Besides, in case after the electron beam drawing in the same condition the substrate was heated at 150° C. for 30 minutes (a step between (C) and (D)), the sensitivity upon the development was $2 \times 10^{-6}$ C./cm$^2$.

EXAMPLE 8

A silicon wafer (substrate 1) was applied with polyimide by spin-coating to form a lower layer 2 of polyimide having a thickness of 1 μm (FIG. 5 (A)). The upper layer 3 was formed in the same way as Example 2 (B) and after irradiation with far ultraviolet rays of 20 mJ (C) was developed with plasma in the same way as Example 1 ((D), (E)). However, the developing time of the lower layer was 30 minutes. Then only at the exposed part was left behind completely the polyimide layer (lower layer 2 of (E)) and a negative type pattern was formed.

EXAMPLE 9

Figure 4:
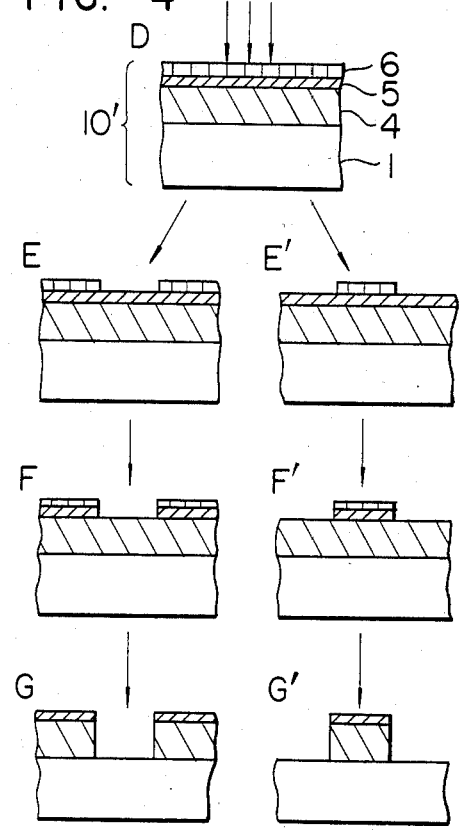

In the same process as Example 3 a plasma-polymerization film of styrene having a thickness of 1 μm was formed on a silicon wafer, and thereon a plasma-polymerization film of tetramethyl-disiloxane was formed, and further thereon a plasma-polymerization film of methylisopropenyl ketone was formed to make up a resist film having a three layer structure as shown in FIG. 4. The respective condition and film thickness are shown in Table 1 below.

TABLE 1

|  |  | Upper layer | Middle layer | Lower layer |
|---|---|---|---|---|
| Conditions of plasma polymerization | Pressure (Torr) | 0.10 | 0.10 | 0.20 |
|  | Electric power (W) | 30 | 50 | 30 |
|  | Time (min) | 5 | 0.5 | 15 |
|  | Film thickness (μm) | 0.20 | 0.04 | 1.05 |
| Conditions of plasma development | Gas | $O_2$ | $O_2 + CF_4$ | $O_2$ |
|  | Pressure (Torr) | 0.5 | 0.5 | 0.2 |
|  | Electric power (W) | 100 | 100 | 200 |

On the resist film a pattern exposure was made by irradiating with 500 mJ/cm$^2$ of far ultraviolet rays through a chrome mask.

This was developed in the following order: the upper layer 6 was developed with an oxygen plasma; using the pattern obtained for the mask the middle layer 5 was developed with a gas mixture plasma of oxygen and $CF_4$; using the resulting pattern of middle layer for the mask the lower layer 4 was developed with an oxygen plasma; and finally a positive type resist pattern as shown in FIG. 4G was obtained. The respective developing condition is shown in Table 1.

In this case the residual film ratio was 78%.

We claim:

1. A method for forming fine resist patterns comprising the sequential steps of:
    (1) forming a lower layer on a substrate by plasma-polymerizing at least one member selected from the group consisting of the following monomers (e) to (i):
        (e) ethylene, propylene, butene, butadiene and isoprene:
        (f) vinyl chloride, vinylidene chloride, chloroprene, vinylidene fluoride, tetrafluoroethylene, trichloroethylene and tetrachloroethylene;
        (g) styrene, chlorostyrene, α-methylstyrene, chloromethylstyrene, brominated styrene and iodinated styrene;
        (h) methyl methacrylate, ethyl methacrylate, propyl methacrylate, butyl methacrylate, phenyl methacrylate, methyl acrylate, vinyl acetate, methyl vinyl ketone, methyl isopropyl ketone, phenyl isopropyl ketone, phenols, ester compounds, ether compounds and epoxy compounds; and
        (i) amides, imides, acrylonitrile and methacrylonitrile;
    (2) forming an upper layer on the above lower layer by plasma-polymerizing the following mixture (k):
        (k) a mixture of at least one organosilicon compound with at least one monomer selected from said monomers (e) to (i),
    said upper layer and said lower layer forming a multilayer film, which multilayer film can be developed, to form a pattern, by a plasma after patternwise exposure of the multilayer film to light or radiation;
    (3) patternwise exposing the multilayer film to irradiation by a light or a radiation;
    (4) exposing the upper layer, after said patternwise exposing, to plasma development in an atmosphere of gas mixture of a fluorinated hydrocarbon and a gas selected from the group consisting of Ar, He, Ne, Xe, $O_2$ and $N_2$ in a partial pressure ratio of 1:(5 to 100); and then
    (5) exposing the lower layer, after development of the upper layer, to plasma development in an atmosphere of $O_2$ or a gas mixture of $O_2$ and a gas selected from the group consisting of Ar, He, Ne, Xe and $N_2$ in a partial pressure ratio of 1:(1 to 10).

2. A method for forming fine resist patterns according to claim 1, wherein the substrate is a silicon wafer or a glass plate coated with vapor deposited chrome.

3. A method for forming fine resist patterns according to claim 1, wherein the plasma development is carried out by the use of a parallel plate electrode type plasma-generator, a barrel type plasma-generator, a high frequency inductive coupling type plasma-generator or a microwave discharge type plasma-generator.

4. A method for forming fine resist patterns according to claim 1, wherein the plasma development is carried out at an electric output of 100 to 300 and a gas pressure of 0.01 to 0.5 Torr.

5. A method for forming fine resist patterns according to claim 1, wherein the mixture (k) further contains at least one compound selected from the group consisting of chloromethylstyrene, iodinated styrene, butadiene monoxide, glycidyl methacrylate, allyl glycidyl ether, epichlorohydrin and epibromohydrin.

6. A method for forming fine photoresist patterns according to claim 1, wherein the upper layer has a thickness of 0.1 to 0.2 μm and the lower layer has a thickness of 0.5 to 2 μm.

7. A method for forming fine resist patterns according to claim 1, wherein a step of heating at 100° to 200° C. is inserted between the irradiation of the multilayer film with a light or a radiation and the plasma development for the upper layer.

8. A method for forming fine resist patterns according to claim 1, wherein the plasma polymerization is carried out by the use of a high-frequency discharge type plasma-generator, a microwave discharge type plasma-generator, or a separative-type plasma generator in which the discharge part and polymerization part are separated.

9. A method for forming fine resist patterns according to claim 1, wherein the plasma polymerization is carried out at an electric output of discharge of 50 W or lower.

10. A method for forming the fine resist patterns according to claim 1, wherein the plasma polymerization is carried out at an electric output of discharge of 20 to 1 W.

11. A method for forming fine resist patterns according to claim 1, wherein the organolsilicon compound is at least one compound selected from the group consisting of silane compounds, siloxane compounds and silazane compounds.

12. A method for forming fine resist patterns according to claim 1, wherein the organosilicon compound is selected from the group consisting of tetramethylsilane, tetravinylsilane, vinyltrimethylsilane, divinyldimethylsilane, trivinylmethylsilane, diallyldimethylsilane, tetraethylsilane, tetramethoxysilane, vinyltrimethoxysilane, methyltriethylsilane, hexamethylidisiloxane, 1,3-divinyl-1,1,3,3-tetramethyldisiloxane and hexamethylsilazane.

13. A method for forming fine resist patterns comprising the sequential steps of:
   (1) forming a lower layer on a substrate by plasma polymirizing at least one member selected from the group consisting of the following monomers (e) to (i):
      (e) plasma-polymerizable hydrocarbons;
      (f) plasma-polymerizable halogenated hydrocarbons;
      (g) styrene and styrene derivatives;
      (h) plasma-polymerizable oxygen-containing compounds; and
      (i) plasma-polymerizable nitrogen-containing compounds;
   (2) forming an upper layer on the above lower layer by plasma-polymerizing the following mixture (k):
      (k) a mixture of at least one organosilicon compound with at least one monomer selected from the monomers (e) to (i),
   said upper and lower layers forming a multilayer film, which multilayer film can be developed, to form a pattern, by plasma after patternwise exposure of the multilayer film to light or radiation;
   (3) patternwise exposing the multilayer film to irradiation by a light or a radiation;
   (4) exposing the upper layer, after said patternwise exposing, to plasma development in an atmosphere of a gas mixture of a fluorinated hydrocarbon and a gas selected from the group consisting of Ar, He, Ne, Xe, $O_2$ and $N_2$ in a partial pressure ratio of 1: (5 to 100); and then
   (5) exposing the lower layer, after development of the upper layer, to plasma development in an atmosphere of $O_2$ or a gas mixture of $O_2$ and a gas selected from the group consisting of Ar, He, Ne, Xe, and $N_2$ in a partial pressure ratio of 1: (1 to 10).

14. A method for forming fine resist patterns according to claim 1 or 13, further comprising the steps of forming, on the upper layer, a plasma polymer film of a ketone compound and, after the irradiation with a light or a radiation and before the plasma development for the upper layer, exposing the plasma polymer film of a ketone compound to plasma development in an atmosphere of $O_2$ and a gas selected from the group consisting or Ar, He, Ne and Xe.

15. The method for forming fine resist patterns according to claim 1 or 13, wherein the thickness of said upper layer is thinner than said lower layer.

16. The method for forming fine resist patterns according to claim 1 or 13, wherein said upper layer has a lower rate of plasma development than said lower layer.

* * * * *